(12) United States Patent
Lujan et al.

(10) Patent No.: US 10,886,588 B2
(45) Date of Patent: Jan. 5, 2021

(54) HIGH DYNAMIC RANGE PROBE USING POLE-ZERO CANCELLATION

(71) Applicant: Keysight Technologies, Inc., Santa Rosa, CA (US)

(72) Inventors: Michael J. Lujan, Colorado Springs, CO (US); Mike T. Mctigue, Colorado Springs, CO (US)

(73) Assignee: Keysight Technologies, Inc., Santa Rosa, CA (US)

( * ) Notice: Subject to any disclaimer, the term of this patent is extended or adjusted under 35 U.S.C. 154(b) by 133 days.

(21) Appl. No.: 16/142,886

(22) Filed: Sep. 26, 2018

(65) Prior Publication Data

US 2020/0099117 A1 Mar. 26, 2020

(51) Int. Cl.
*H01P 1/26* (2006.01)
*G01R 1/067* (2006.01)
*H03F 3/04* (2006.01)

(52) U.S. Cl.
CPC ............ *H01P 1/26* (2013.01); *G01R 1/06766* (2013.01); *H03F 3/04* (2013.01); *H03F 2200/129* (2013.01)

(58) Field of Classification Search
CPC ......... H01P 1/26; G01R 1/06766; H03F 3/04; H03F 2200/129
See application file for complete search history.

(56) References Cited

U.S. PATENT DOCUMENTS

| | | |
|---|---|---|
| 6,218,826 B1 | 4/2001 | Nightingale |
| 6,379,183 B1 | 4/2002 | Ayres et al. |
| 6,383,031 B1 | 5/2002 | Law et al. |
| 6,385,550 B1 | 5/2002 | Jansen et al. |
| 6,400,167 B1 | 6/2002 | Gessford et al. |
| 6,402,549 B1 | 6/2002 | Ayres et al. |
| 6,402,565 B1 | 6/2002 | Pooley et al. |
| 6,459,287 B1 | 10/2002 | Nightingale et al. |
| 6,483,284 B1* | 11/2002 | Eskeldson .......... G01R 1/06772 324/121 R |

(Continued)

FOREIGN PATENT DOCUMENTS

| | | |
|---|---|---|
| EP | 2687858 A1 | 1/2014 |
| EP | 2720047 A1 | 4/2014 |

(Continued)

*Primary Examiner* — Tung X Nguyen
*Assistant Examiner* — Feba Pothen

(57) ABSTRACT

An oscilloscope probe includes a tip network, a low-loss signal cable, and a terminating assembly. The tip network is connected to the signal cable and is configured to electrically connect to a device under test via a tip network node. The terminating assembly includes an amplifier, a feedback network and a terminating attenuator. The amplifier has an inverting input, a non-inverting input connected to ground, and an amplifier output configured to connect to an oscilloscope input. The feedback network is connected between the inverting input and the amplifier output. The terminating attenuator includes a first loop circuit and a second loop circuit. The first loop circuit is provided between the signal cable and the inverting input of the amplifier. The second loop circuit is provided between the signal cable, and ground. Resistance of terminating resistors in the loop circuits are selected to match characteristic impedance of the signal cable.

18 Claims, 8 Drawing Sheets

(56) References Cited

U.S. PATENT DOCUMENTS

| | | | |
|---|---|---|---|
| 6,525,522 | B1 | 2/2003 | Pickerd |
| 6,600,330 | B1 | 7/2003 | Nightingale et al. |
| 6,603,297 | B1 | 8/2003 | Gessford et al. |
| 6,614,221 | B2 | 9/2003 | Cushing et al. |
| 6,659,812 | B2 | 12/2003 | Gessford et al. |
| 6,725,170 | B1 | 4/2004 | Hickman |
| 6,731,104 | B1 | 5/2004 | Yang |
| 6,734,689 | B1 | 5/2004 | Yang |
| 6,801,042 | B2 | 10/2004 | McPherson et al. |
| 7,017,435 | B2 | 3/2006 | Pooley et al. |
| 7,056,134 | B2 | 6/2006 | Martin et al. |
| 7,161,366 | B2 | 1/2007 | Herrick et al. |
| 7,253,648 | B2 | 8/2007 | Yang |
| 7,362,112 | B2 | 4/2008 | Yang et al. |
| 7,405,575 | B2 | 7/2008 | Tan et al. |
| 7,408,363 | B2 | 8/2008 | Tan et al. |
| 7,414,411 | B2 | 8/2008 | Tan et al. |
| 7,424,177 | B2 | 9/2008 | Yakymyshyn et al. |
| 7,463,015 | B2 | 12/2008 | Mende et al. |
| 7,634,747 | B2 | 12/2009 | Hagen et al. |
| 7,880,487 | B2 | 2/2011 | Petrick |
| 7,902,848 | B2 | 3/2011 | Eccleston et al. |
| 7,940,067 | B2 | 5/2011 | Roland et al. |
| 8,067,718 | B2 | 11/2011 | Nordstrom et al. |
| 8,089,293 | B2 | 1/2012 | Hagen |
| 8,091,225 | B2 | 1/2012 | Roland et al. |
| 8,154,316 | B2 | 4/2012 | Lagerberg et al. |
| 8,278,940 | B2 | 10/2012 | Bartlett et al. |
| D676,562 | S | 2/2013 | Marzynski et al. |
| 8,436,624 | B2 | 5/2013 | Bartlett et al. |
| 8,456,173 | B2 | 6/2013 | Knierim et al. |
| 8,564,308 | B2 | 10/2013 | Bartlett et al. |
| 8,611,436 | B2 | 12/2013 | Knierim et al. |
| D699,360 | S | 2/2014 | Marzynski et al. |
| 8,643,396 | B2 | 2/2014 | Spinar et al. |
| 8,723,530 | B2 | 5/2014 | Bartlett et al. |
| 8,791,706 | B2 | 7/2014 | Bartlett et al. |
| 8,810,258 | B2 | 8/2014 | Bartlett et al. |
| 8,826,754 | B2 | 9/2014 | Spinar et al. |
| 8,922,231 | B2 | 12/2014 | Lagerberg et al. |
| 8,924,175 | B2 | 12/2014 | Smith et al. |
| 8,936,485 | B2 | 1/2015 | Gessford et al. |
| 9,075,696 | B2 | 7/2015 | Smith et al. |
| D735,869 | S | 8/2015 | Marzynski et al. |
| 9,140,723 | B2 | 9/2015 | Booman et al. |
| 9,194,888 | B2 | 11/2015 | Knierim |
| 9,476,960 | B2 | 10/2016 | Mende et al. |
| 9,482,695 | B2 | 11/2016 | McGrath, Jr. |
| 9,557,399 | B2 | 1/2017 | Mende et al. |
| 9,622,336 | B2 | 4/2017 | Rockwell |
| 9,625,495 | B2 | 4/2017 | Mende et al. |
| 9,697,473 | B2 | 7/2017 | Abdo |
| 2013/0271218 | A1* | 10/2013 | Zou .................... H03G 3/004 330/282 |

FOREIGN PATENT DOCUMENTS

| | | |
|---|---|---|
| EP | 2843423 A1 | 3/2015 |
| EP | 2853912 A1 | 4/2015 |
| EP | 2866037 A1 | 4/2015 |
| EP | 2876739 A1 | 5/2015 |
| EP | 2887089 A1 | 6/2015 |
| EP | 2913684 A1 | 9/2015 |
| EP | 3037828 A1 | 6/2016 |
| EP | 3056728 A1 | 8/2016 |
| EP | 3130928 A1 | 2/2017 |
| EP | 3139182 A1 | 3/2017 |
| EP | 3156780 A1 | 4/2017 |

* cited by examiner

HIGH DYNAMIC RANGE PROBE USING POLE-ZERO CANCELLATION

BACKGROUND

An oscilloscope probe is used to transfer an electrical signal from a device under test (DUT) to an input of an oscilloscope which measures the electrical signal. Since a probe tip of the oscilloscope probe makes an electrical connection to the DUT a high impedance should be presented at the probe tip so as not to load the electrical signal being measured. A bandwidth of a system that includes the oscilloscope probe should be larger than the electrical signal being measured to pass an accurate representation of the electrical signal to the oscilloscope. A typical oscilloscope probe includes a probe tip assembly, a length of probe cable, and a termination assembly that includes a connector. The probe tip assembly is connected to the length of probe cable. The length of probe cable is then connected to the termination assembly that includes the connector to provide an electrical connection to the oscilloscope. To allow a user to conveniently probe the DUT, the probe cable may be several feet in length. As such, the probe cable can be a significant source of loss as measurement bandwidth increases.

A frequency response that is characteristic of the transfer function capability of the oscilloscope probe can be plotted using magnitude on the ordinate (y) axis versus frequency on the abscissa (x) axis. Ideally, the frequency response of the oscilloscope probe is flat over the bandwidth of the oscilloscope probe, and oscilloscope probes are designed to maximize the flatness of the frequency response among other objectives.

An example of a known oscilloscope probe is the passive resistive divider oscilloscope probe shown in FIG. 1A. In FIG. 1A, the passive resistive divider oscilloscope probe includes a tip resistor 101, a cable 102, and a terminating resistor 103. The passive resistive divider oscilloscope probe in FIG. 1A is arranged so that the input Vin to the probe tip from the DUT is on the left and the output Vout to the oscilloscope is on the right. Cable characteristic impedance Zo of the cable 102 is typically 50 Ohms. To utilize the highest bandwidth and obtain the flattest frequency response the terminating resistor 103 should equal the cable characteristic impedance Zo, and this places an upper limit on the tip resistor 101. For a 10:1 passive resistive divider probe, if the terminating resistor 103 has resistance of 50 Ohms to match the typical cable characteristic impedance Zo, resistance of the tip resistor 101 would equal 450 Ohms. However, resistance of 450 Ohms for the tip resistor 101 will start to load down a DUT if source resistance of the DUT is above ~45 Ohms, so that parasitic capacitance to GND at the probe tip and across the terminating resistor 103 will limit bandwidth.

The active pole-zero cancellation probe of FIG. 1B was developed to address limits of the passive resistive divider oscilloscope probe in FIG. 1A. In the active pole-zero cancellation probe of FIG. 1B, the active pole-zero cancellation probe includes the tip resistor 101, the cable 102, the terminating resistor 103, a tip capacitor 104, a feedback resistor 105, a feedback capacitor 106, and an amplifier 107. The term "pole-zero" cancellation is a reference to poles and zeros which cancel each other out in the frequency response. By way of explanation, in transfer functions such as frequency responses, poles are the frequencies for which the denominator becomes zero, and zeros are the frequencies for which the numerator becomes zero. In FIG. 1B, a feedback pole cancels a tip zero when values of the resistors and capacitors are set in a manner described below, and the probe of FIG. 1B therefore has an active pole-zero cancellation. More particularly, the tip resistor 101 and the tip capacitor 104 set a zero in the probe frequency response, and the feedback resistor 105 and the feedback capacitor 106 have values selected to form a pole in the probe frequency response that equals or otherwise offsets the zero in the probe frequency response. The offsetting effectively flattens the probe frequency response in a frequency region defined by the pole and the zero.

As further explanation, a tip network in the active pole-zero cancellation probe of FIG. 1B has the tip resistor 101 in parallel with a tip capacitor 104. The tip capacitor 104 counters the effect of parasitic capacitance to GND at the probe tip by pulling more current from the DUT as frequency increases, and this results in an s-plane tip zero in the input current Iin(s). Iin(s) for the active pole-zero cancellation probe of FIG. 1B is set by equation (1) as follows:

$$Iin(s) = \frac{Vin(s)(sCtipRtip + 1)}{Rtip} \quad (1)$$

In equation (1), Iin(s) is the current to and in the cable 102, Ctip is capacitance of the tip capacitor 104 and Rtip is resistance of the tip resistor 101. Iin(s) travels down the cable 102 and is terminated into the terminating resistor 103. Amplifier 107 is configured as a summing junction amplifier and forces Iin(s) to flow into a feedback network that includes the feedback resistor 105 and the feedback capacitor 106 in parallel with the feedback resistor 105. The summing junction of the amplifier 107 is the node at, or directly connected to, the inverting input of the amplifier 107, which is denoted by the minus (−) sign.

In the active pole-zero cancellation probe of FIG. 1B, Iin flowing into the feedback network of the feedback resistor 105 and the feedback capacitor 106 introduces the feedback pole into the s-plane expression for Vout, as expressed by equation (2) as follows:

$$Vout(s) = -\frac{Iin(s)Rfb}{sCfbRfb + 1} \quad (2)$$

In equation (2), Iin(s) is the current to and in the cable 102, Rfb is resistance of the feedback resistor 105 and Cfb is capacitance of the feedback capacitor 106. Substituting equation (1) into equation (2) gives equation (3) as follows:

$$\frac{Vout(s)}{Vin(s)} = -\frac{Rfb(sCtipRtip + 1)}{Rtip(sCfbRfb + 1)} \quad (3)$$

In equation (3), Rfb is resistance of the feedback resistor 105, Cfb is capacitance of the feedback capacitor 106, Ctip is capacitance of the tip capacitor 104 and Rtip is resistance of the tip resistor 101. If CfbRfb=CtipRtip the feedback pole cancels the tip zero and equation (3) is simplified to equation (4) as follows:

$$\frac{Vout}{Vin} = -\frac{Rfb}{Rtip} = -\frac{Ctip}{Cfb} \quad (4)$$

If the active pole-zero cancellation probe of FIG. 1B is a 10:1 divider probe, it will have Rtip=10Rfb, and Cfb=10Ctip. As a result, resistance for Rtip of a typical high impedance probe might be several MegaOhms and capacitance for Ctip might be several picofarads. Such a high impedance probe is limited in dynamic range since as Vin gets larger, slewing current Iin gets larger. An amplifier 107 has a finite slew rate which is the maximum rate the amplifier 107 can respond to an abrupt change in input level. Insofar as the finite slew rate of the amplifier 107 puts an upper limit on Iin, the amplifier 107 sinks Iin.

A topology such as that shown in FIG. 2 (described below) is introduced to increase the allowable amplitude of Vin using a simple terminating attenuator, but the simple terminating attenuator in the topology of FIG. 2 then results in an unacceptable low frequency amplifier noise gain.

BRIEF DESCRIPTION OF THE DRAWINGS

The illustrative embodiments are best understood from the following detailed description when read with the accompanying drawing figures. It is emphasized that the various features are not necessarily drawn to scale. In fact, the dimensions may be arbitrarily increased or decreased for clarity of discussion. Wherever applicable and practical, like reference numerals refer to like elements throughout the drawings and written description.

DETAILED DESCRIPTION

Figure 1A:
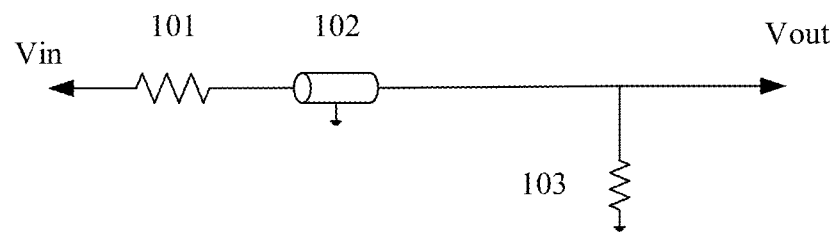
FIG. 1A illustrates a known passive resistance divider probe.

In the following detailed description, for purposes of explanation and not limitation, representative embodiments disclosing specific details are set forth in order to provide a thorough understanding of an embodiment according to the present teachings. Descriptions of known systems, devices, materials, methods of operation and methods of manufacture may be omitted so as to avoid obscuring the description of the representative embodiments. Nonetheless, systems, devices, materials and methods that are within the purview of one of ordinary skill in the art are within the scope of the present teachings and may be used in accordance with the representative embodiments. It is to be understood that the terminology used herein is for purposes of describing particular embodiments only, and is not intended to be limiting. The defined terms are in addition to the technical and scientific meanings of the defined terms as commonly understood and accepted in the technical field of the present teachings.

It will be understood that, although the terms first, second, third etc. may be used herein to describe various elements or components, these elements or components should not be limited by these terms. These terms are only used to distinguish one element or component from another element or component. Thus, a first element or component discussed below could be termed a second element or component without departing from the teachings of the present disclosure.

The terminology used herein is for purposes of describing particular embodiments only and is not intended to be limiting. As used in the specification and appended claims, the singular forms of terms 'a', 'an' and 'the' are intended to include both singular and plural forms, unless the context clearly dictates otherwise. Additionally, the terms "comprises", and/or "comprising," and/or similar terms when used in this specification, specify the presence of stated features, elements, and/or components, but do not preclude the presence or addition of one or more other features, elements, components, and/or groups thereof. As used herein, the term "and/or" includes any and all combinations of one or more of the associated listed items.

Unless otherwise noted, when an element or component is said to be "connected to", "coupled to", or "adjacent to" another element or component, it will be understood that the element or component can be directly connected or coupled to the other element or component, or intervening elements or components may be present. That is, these and similar terms encompass cases where one or more intermediate elements or components may be employed to connect two elements or components. However, when an element or component is said to be "directly connected" to another element or component, this encompasses only cases where the two elements or components are connected to each other without any intermediate or intervening elements or components.

In view of the foregoing, the present disclosure, through one or more of its various aspects, embodiments and/or specific features or sub-components, is thus intended to bring out one or more of the advantages as specifically noted below. For purposes of explanation and not limitation, example embodiments disclosing specific details are set forth in order to provide a thorough understanding of an embodiment according to the present teachings. However, other embodiments consistent with the present disclosure that depart from specific details disclosed herein remain within the scope of the appended claims. Moreover, descriptions of well-known apparatuses and methods may be omitted to not obscure the description of the example embodiments. Such methods and apparatuses are within the scope of the present disclosure.

Figure 2:
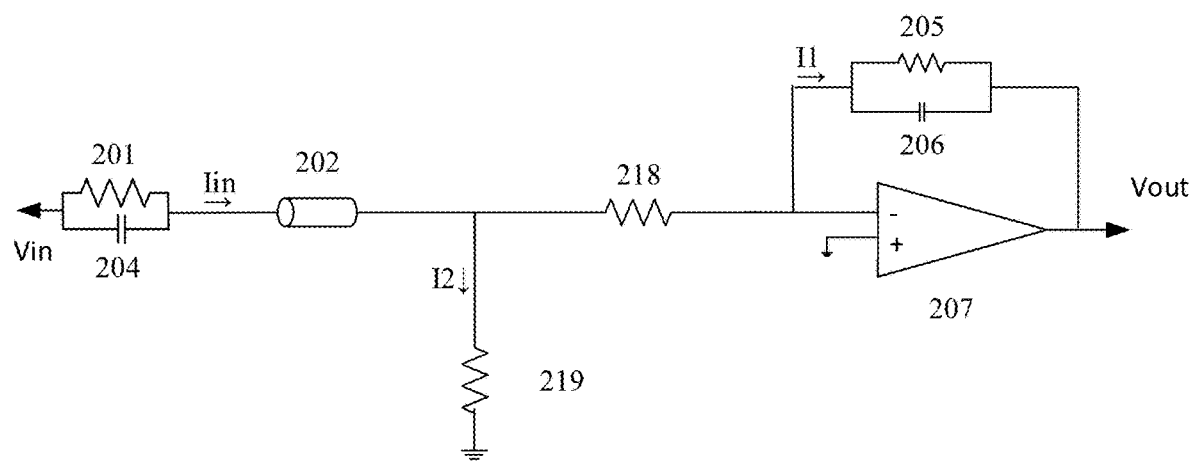
FIG. 2 illustrates an active pole-zero oscilloscope probe with a simple terminating attenuator, in accordance with a representative embodiment.

FIG. 2 illustrates an active pole-zero oscilloscope probe with a simple terminating attenuator, in accordance with a representative embodiment.

The active pole-zero oscilloscope probe with the simple terminating attenuator of FIG. 2 includes a first resistor 201, a low-loss signal cable 202, a first capacitor 204, a second resistor 205, a second capacitor 206, an amplifier 207, a first terminating resistor 218, and a second terminating resistor 219. In FIG. 2 and other embodiments herein, the amplifier 207 has a non-inverting input connected to ground, an inverting input, and an amplifier output configured to connect to an oscilloscope input. The first terminating resistor 218 and the second terminating resistor 219 replace the terminating resistor 103 in FIGS. 1A and in FIG. 1B. That is, the terminating resistor 103 in FIG. 1B is split into the first terminating resistor 218 to the summing junction, and the second terminating resistor 219 to ground GND.

For FIG. 2 and embodiments described later herein, the low-loss signal cable 202 is terminated in it's characteristic impedance at the oscilloscope and is used to transfer the signal from the DUT to the oscilloscope. A "low-loss signal cable" described herein is a cable with a center conductor having DC resistance between 0.5 Ohms and 5 Ohms.

Figure 1B:
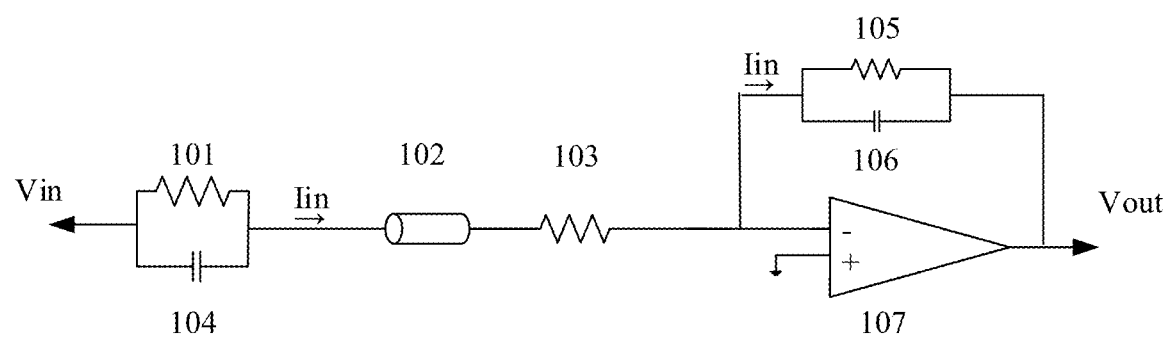
FIG. 1B illustrates a known active pole-zero cancellation probe.

The active pole-zero oscilloscope probe of FIG. 2 includes similarities with the known pole-zero cancellation probe of FIG. 1B. For example, in FIG. 2 a tip circuit includes the first resistor 201 and the first capacitor 204 in parallel with the first resistor 201. Additionally, a feedback circuit includes the second resistor 205, the second capacitor 206 in parallel with the second resistor 205, and the amplifier 207. In FIG. 2, the simple terminating attenuator includes the first terminating resistor 218 and the second terminating resistor 219, and the simple terminating attenuator attenuates Iin before the amplifier 207.

The topology in FIG. 2 helps increase the allowable amplitude of Vin by attenuating Iin before it reaches the amplifier 207. A portion of the input current Iin is also shunted to GND as I2. Rterm1 is resistance of the first terminating resistor 218, and Rterm2 is resistance of the second terminating resistor 219. If Rterm1∥Rterm2=the cable characteristic impedance of the low-loss signal cable 202, i.e., Zo, the line is still terminated with Zo. However, this means then that a low impedance path exists from the summing junction to GND through the first terminating resistor 218 and the second terminating resistor 219. The noise gain of amplifier 207 is set by equation (5) as follows:

$$Ngain(s) = 1 + \frac{Rfb}{(sCfbRfb + 1)(Rterm1 + Rterm2)} \quad (5)$$

As described previously in relation to FIG. 1B, a typical high impedance oscilloscope probe may have the tip network resistor Rtip and feedback network resistor Rfb of several MegaOhms. The tip network is connected to the low-loss signal cable 202 and is configured to electrically connect the oscilloscope probe to the device under test (DUT) via a tip network node between the tip network resistor Rtip and the tip network capacitor Ctip.

Depending on attenuation value, the first terminating resistor 218 and the second terminating resistor 219 of FIG. 2 will combined be at most several hundred Ohms. However, this then means the low frequency noise gain of the amplifier 207 can be several thousand. Offset, drift, and low frequency noise of the amplifier 207 will be multiplied by this noise gain to the output Vout, and for a typical amplifier this may not be acceptable for the given parameters. Accordingly, the topology in FIG. 2 presents a problem with low frequency noise gain caused by the terminating attenuator shown therein.

Figure 3:
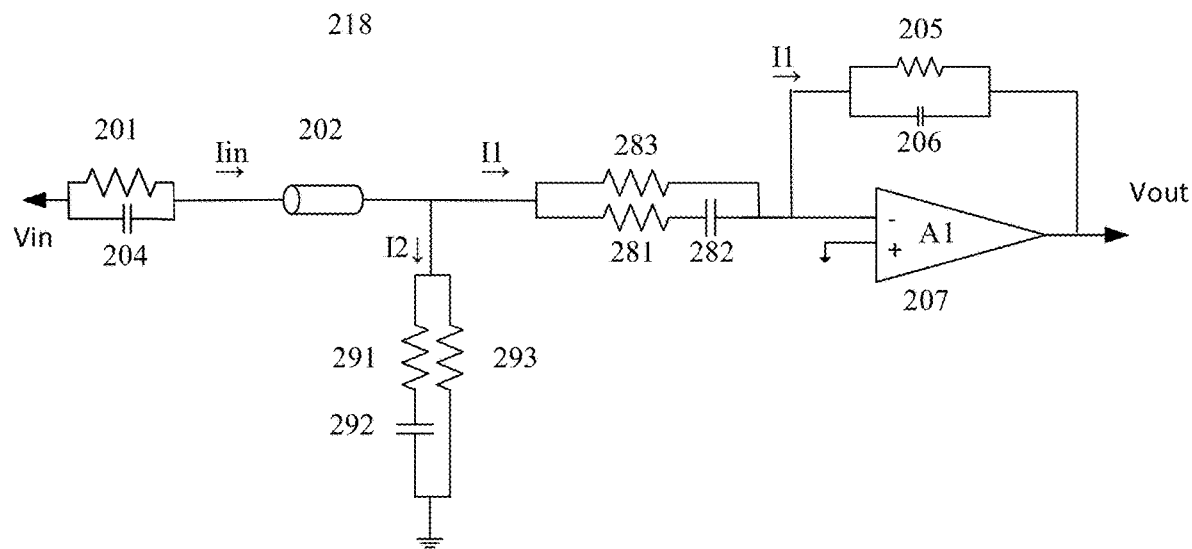
FIG. 3 illustrates an active pole-zero oscilloscope probe with an AC-coupled terminating attenuator, in accordance with a representative embodiment.

FIG. 3 illustrates an active pole-zero oscilloscope probe with an AC-coupled terminating attenuator, in accordance with a representative embodiment.

The active pole-zero oscilloscope probe with the AC-coupled terminating attenuator of FIG. 3 includes the first resistor 201, the first capacitor 204 in parallel with the first resistor 201, the low-loss signal cable 202, the second resistor 205, the second capacitor 206 and the amplifier 207. The active pole-zero oscilloscope probe with the AC-coupled terminating attenuator of FIG. 3 also includes a first loop circuit between the low-loss signal cable 202 and the inverting input of the amplifier 207, and a second loop circuit between the low-loss signal cable 202 and ground. The first loop circuit includes a first terminating resistor 281, a first terminating capacitor 282 in series with the first terminating resistor 281, and a first direct current coupled resistor 283 in parallel with the first terminating resistor 281 and the first terminating capacitor 282. The second loop circuit includes a second terminating resistor 291, a second terminating capacitor 292 in series with the second terminating resistor 291, and a second direct current coupled resistor 293 in parallel with the second terminating resistor 291 and the second terminating capacitor 292. The AC-coupled terminating attenuator in FIG. 3 includes the first loop circuit and the second loop circuit. As described herein, for the embodiment of FIG. 3 and other embodiments, the first terminating capacitor 282, the second terminating capacitor 292, the first terminating resistor 281 and the second terminating resistor 291 or equivalent elements may be set to terminate the low-loss signal cable 202 at a frequency lower than 1/cable time delay. Additionally, the first direct current coupled resistor 283 and the second direct current coupled resistor 293 may have resistances higher than resistances of the first terminating resistor 281 and the second terminating resistor 291 and selected to reduce low frequency gain of the amplifier 207.

In the embodiment of FIG. 3, a probe frequency response of the active pole-zero oscilloscope probe in FIG. 3 is created by the first resistor 201, the first capacitor 204, cable capacitance of the low-loss signal cable 202, the first terminating resistor 281, the first direct current coupled resistor 283, the second terminating resistor 291, the second direct current coupled resistor 293, the first terminating capacitor 282, and the second terminating capacitor 292. The first direct current coupled resistor 283 and the second direct current coupled resistor 293 provide low-frequency attenuation. The first terminating resistor 281 and the second terminating resistor 291 provide high-frequency attenuation, and the first terminating capacitor 282 and the second terminating capacitor 292 provide AC attenuation.

In the embodiment of FIG. 3, at low frequencies where ω<<1/CtermRterm the AC-coupled terminating attenuator is DC coupled to GND through the first direct current coupled resistor 283 and the second direct current coupled resistor 293. The first direct current coupled resistor 283 and the second direct current coupled resistor 293 may have resistance values chosen to be much larger than resistance values of the first terminating resistor 281 and the second terminating resistor 291 to reduce low frequency noise gain.

In FIG. 3, a feedback pole may cancel a tip zero when values of the resistors and capacitors are set in the manner previously described, such that the active pole-zero oscilloscope probe in FIG. 3 has an active pole-zero cancellation. More particularly, the first resistor 201 and the first capacitor 204 may set a zero in the probe frequency response, and the second resistor 205 and the second capacitor 206 may have values selected to form a pole in the probe frequency response that equals or otherwise offsets the zero in the probe frequency response. Moreover, values of the first terminating capacitor 282, the second terminating capacitor 292, the first direct current coupled resistor 283 and the second direct current coupled resistor 293 may create a zero in the probe frequency response and may be selected to cancel or otherwise offset a pole in the probe frequency response, to effectively flatten the probe frequency response in a frequency region defined by the pole and the zero.

In FIG. 3 and other embodiments herein, a terminating assembly may include the amplifier 207, the feedback network that includes the second resistor 205 and the second capacitor 206, and a terminating attenuator that includes the first loop circuit and the second loop circuit.

Figure 4:
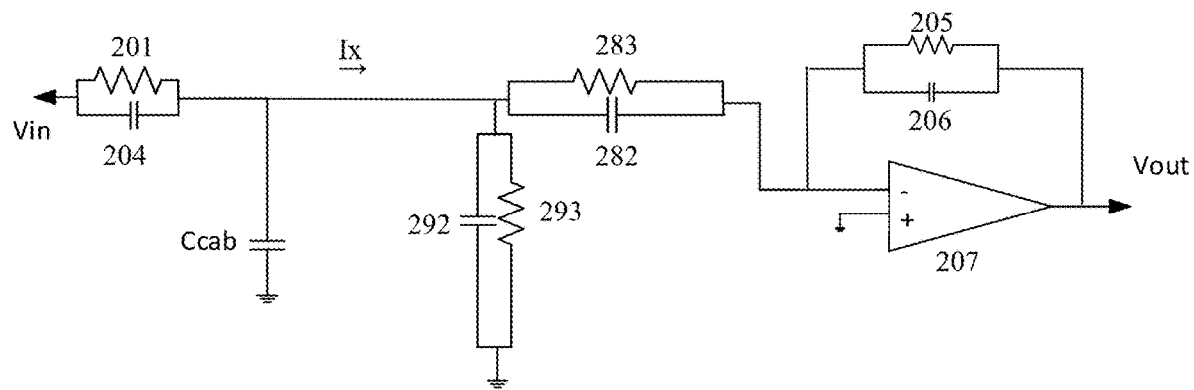
FIG. 4 illustrates a simplified low frequency model for the active pole-zero oscilloscope probe with the AC-coupled terminating attenuator of FIG. 3.

FIG. 4 illustrates a simplified low frequency model for the active pole-zero oscilloscope probe with the AC-coupled terminating attenuator of FIG. 3.

The simplified low frequency model of FIG. 4 includes the first resistor 201, the first capacitor 204 in parallel with the first resistor 201, the second resistor 205, the second capacitor 206 and the amplifier 207. The tip network that includes the first resistor 201 and the first capacitor 204 is connected to the low-loss signal cable 202 and is again configured to electrically connect the oscilloscope probe to the device under test (DUT) via a tip network node between the first resistor 201 and the first capacitor 204.

The simplified low frequency model of FIG. 4 also includes a first loop circuit between the tip network and the inverting input of the amplifier 207, and a second loop circuit between the tip network and ground. The first loop circuit includes the first terminating capacitor 282 and a first direct current coupled resistor 283 in parallel with the first terminating capacitor 282. The second loop circuit includes a second terminating capacitor 292, and a second direct current coupled resistor 293 in parallel with the second terminating capacitor 292.

In the simplified low frequency model of FIG. 4, the first terminating resistor 281 and the second terminating resistor 291 are removed compared to the active pole-zero oscilloscope probe with the AC-coupled terminating attenuator of FIG. 3. The first terminating resistor 281 and the second terminating resistor 291 can be removed since their resistance is much lower than the impedance of the first terminating capacitor 282 and the second terminating capacitor 292. At low frequencies the low-loss signal cable 202 is now terminated to a much larger impedance than cable characteristics impedance Zo, and thus appears as an additional capacitance, Ccab, to GND.

Figure 5:
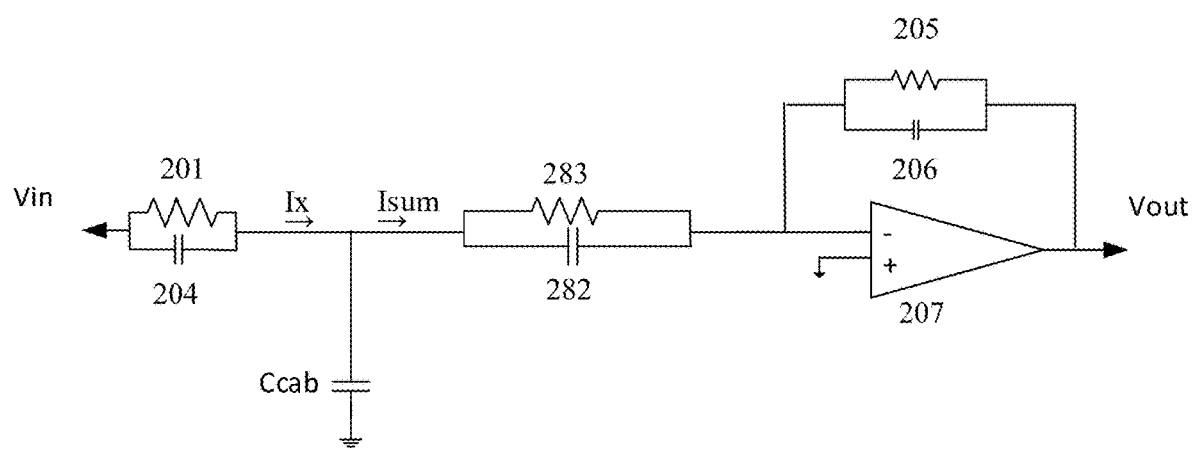
FIG. 5 illustrates another simplified low frequency model for the active pole-zero oscilloscope probe with an AC-coupled terminating attenuator of FIG. 3.

FIG. 5 illustrates another simplified low frequency model for the active pole-zero oscilloscope probe with an AC-coupled terminating attenuator of FIG. 3.

The simplified low frequency model of FIG. 5 includes the first resistor 201, the first capacitor 204 in parallel with the first resistor 201, the second resistor 205, the second capacitor 206 and the amplifier 207. The simplified low frequency model of FIG. 5 also includes a first loop circuit between the tip network and the inverting input of the amplifier 207, but not the previous second loop circuit between the tip network and ground. The first loop circuit includes the first terminating capacitor 282 and a first direct current coupled resistor 283 in parallel with the first terminating capacitor 282.

In order to calculate an expression for the portion of the current Ix that reaches the attenuator in FIG. 4 as a function of Vin, one further simplification can be made. Since the first direct current coupled resistor 283 and the first terminating resistor 281 connect to the summing junction, which is held to 0V by the amplifier 207, they essentially appear in parallel with the second direct current coupled resistor 293 and the second terminating resistor 291. This leads to the further simplified circuit of FIG. 5.

Calculation of Isum in for the simplified circuit of FIG. 5 in terms of Vin yields equation (6) as follows:

$$Isum(s) = \frac{Vin(s)(sCtipRtip + 1)(sCtermRdc + 1)}{sRtipRdc(Ctip + Ccab + Cterm) + Rtip + Rdc} \quad (6)$$

Comparing equation (6) with equation (1) shows the addition of Cterm and Rdc to the termination results in an additional zero and pole in the expression for the current that reaches the amplifier. Ideally, the Isum(s) expression would only contain the zero involving the first resistor 201 and the first capacitor 204 (i.e., CtipRtip), which can then be canceled with the feedback pole involving the second resistor 205 and the second capacitor 206 (i.e., CfbRfb).

If Rdc is chosen such that Rdc satisfies equation (7) as follows:

$$Rdc = \frac{Rtip(Ctip + Ccab)}{Cterm} \quad (7)$$

the zero involving CtermRdc in equation (6) cancels the pole in equation (6). The transfer function Vout(s)/Vin(s) becomes equation (8) as follow:

$$\frac{Vout(s)}{Vin(s)} = -\frac{RfbCterm}{Rtip(Cterm + Ctip + Ccab)} * \frac{sCtipRtip + 1}{sCfbRfb + 1} \quad (8)$$

In equation (8) above, values of the tip and feedback resistors and the tip and feedback capacitors are chosen to meet equation (9) as follows:

$$CfbRfb = CtipRtip \quad (9)$$

That is, values of the tip and feedback resistors and the tip and feedback capacitors are chosen such that the feedback pole cancels the tip zero.

Manipulating equations (7), (8), and (9) shows that the DC gain is a ratio of resistors and the Midband gain a ratio of capacitors. DC gain is expressed by equation (10) and Midband gain is expressed by equation (11) as follows:

$$DC\ Gain = \frac{Vout}{Vin} = -\frac{Rfb}{Rtip + Rdc} \quad (10)$$

$$Midband\ Gain = \frac{Vout}{Vin} = -\frac{CtermCtip}{Cfb(Cterm + Ctip + Ccab)} \quad (11)$$

$$(\omega \ll 1/RtermCterm)$$

At high frequency where $\omega \gg 1/RtermCterm$, the termination approaches Rterm which will properly terminate the cable if Rterm=cable characteristic impedance Zo of the cable. The high frequency (HF) gain is then expressed by equation (12) as follows:

$$HF\ Gain = \frac{Vout}{Vin} = -\frac{Ctip}{Cfb} \quad (12)$$

The nonflatness between Midband and HF gain is minimized if Cterm>>Ccab+Ctip.

Figure 6:
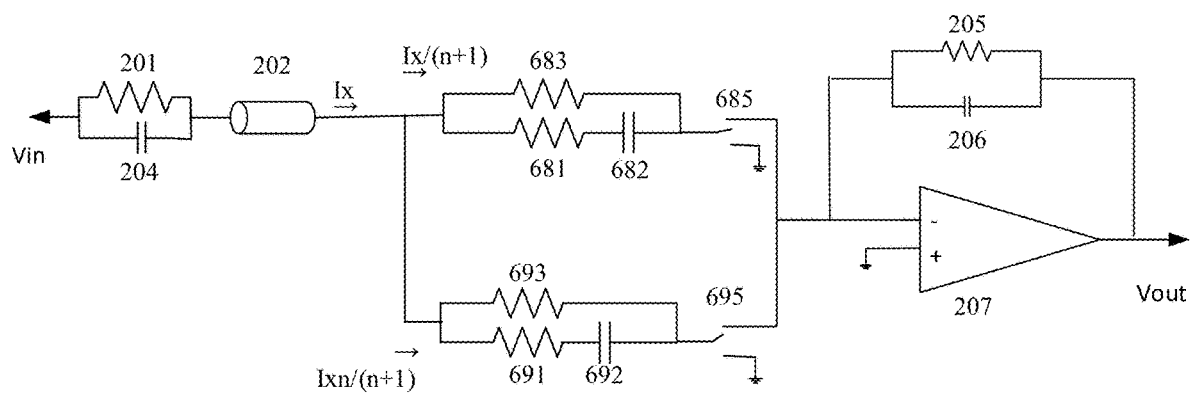
FIG. 6 illustrates an active pole-zero oscilloscope probe with switchable attenuation, in accordance with another representative embodiment.

FIG. 6 illustrates an active pole-zero oscilloscope probe with switchable attenuation, in accordance with another representative embodiment.

The active pole-zero oscilloscope probe with switchable attenuation of FIG. 6 includes the first resistor 201, the first capacitor 204 in parallel with the first resistor 201, the low-loss signal cable 202, the second resistor 205, the second capacitor 206 and the amplifier 207. The active pole-zero oscilloscope probe with switchable attenuation of FIG. 6 also includes a first loop circuit and a second loop circuit. The first loop circuit and the second loop circuit are dynamically switchable between the low-loss signal cable 202 and the inverting input of the amplifier 207, and between the low-loss signal cable 202 and ground. The first loop circuit includes a first terminating resistor 681 and a first terminating capacitor 682 in series with the first terminating resistor 681, and a first direct current coupled resistor 683 in parallel with the first terminating resistor 681 and the first terminating capacitor 682. The second loop circuit includes a second terminating resistor 691 and a second terminating capacitor 692 in series with the second terminating resistor 691, and a second direct current coupled resistor 693 in parallel with the second terminating resistor 691 and the second terminating capacitor 692. As described herein, for the embodiment of FIG. 6 and other embodiments, the first terminating capacitor 682, the second terminating capacitor 692, the first terminating resistor 681 and the second terminating resistor 691 or equivalent elements may be set to terminate the low-loss signal cable 202 at a frequency lower than 1/cable time delay.

In the embodiment of FIG. 6, a dynamically switchable two-section attenuator is used to divide the input current. The two sections are each switchable via a switching network, so that one can be connected to ground via connections to ground and the other can be connected to the summing junction of the amplifier 207 via connections to the summing junction of the amplifier 207. A first switch 685 switches the first loop circuit and a second switch 695 switches the second loop circuit. That is, the first switch 685 and the second switch 695 are used to select which branch currents are routed to the summing junction of the amplifier 207. This arrangement provides input current attenuation values of 1, n/(n+1), and 1/(n+1).

The resistance values of the first direct current coupled resistor 683 and the second direct current coupled resistor 693 and the first terminating capacitor 682 and the second terminating capacitor 692 are chosen to satisfy equation (7) above. Additionally, cable characteristic impedance Zo of the cable=Rterm∥nRterm. For example, values of the first terminating capacitor 682, the second terminating capacitor 692, the first direct current coupled resistor 683 and the second direct current coupled resistor 693 may create a zero in the probe frequency response and may be selected to cancel a pole in the probe frequency response to flatten the probe frequency response in a frequency region defined by the pole and the zero.

The technique of FIG. 6 can be extended with multiple attenuator sections provided the net Rterm seen by the cable=cable characteristic impedance Zo of the cable, and the net Rdc and Cterm satisfy equation (7).

Figure 7:
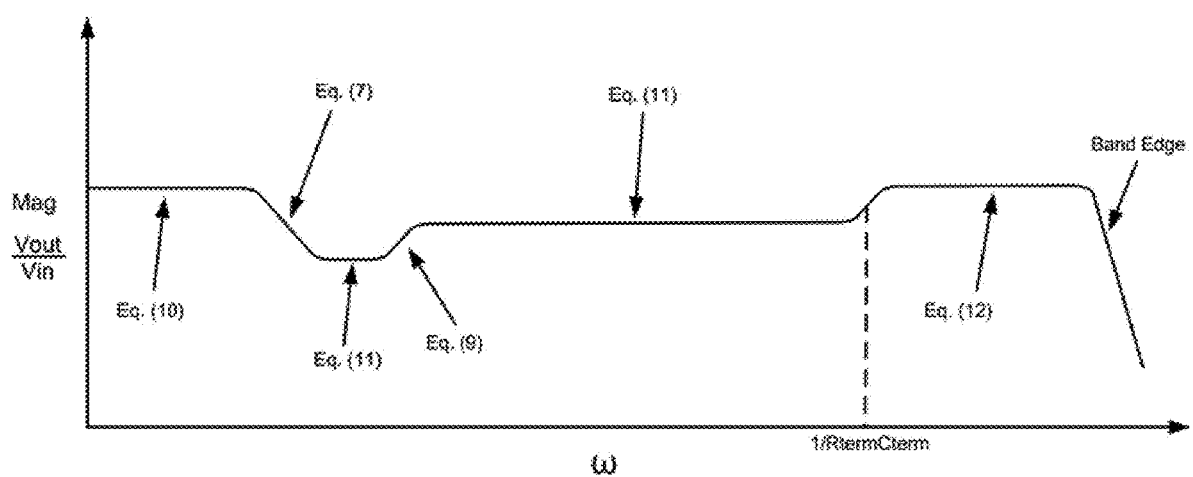
FIG. 7 illustrates a probe frequency response magnitude with breakpoint dependencies indicated thereon, in accordance with a representative embodiment.

FIG. 7 illustrates a probe frequency response magnitude with breakpoint dependencies indicated thereon, in accordance with a representative embodiment.

In FIG. 7, a frequency response magnitude for an oscilloscope probe described herein shows the breakpoint dependencies based on the equations developed above. In an embodiment, elements of the oscilloscope probe are implemented on an integrated circuit. For example, the amplifier 207, and the feedback network of the second resistor 205 and the second capacitor 206 may be implemented on an integrated circuit. The second resistor 205 and the second capacitor 206 may be made electronically trimmable to compensate for integrated circuit process variation, and variation of components of the probe tip including the first resistor 201 and the first capacitor 204. The second resistor 205 and the second capacitor 206 may be trimmed to remove the nonflatness designated by Eq. (9) in FIG. 7. Resistance of the second resistor 205 can also be used to trim low frequency gain according to equation (10). Capacitance of the second capacitor 206 can be used to trim midband and high frequency gain together according to equation (11) and equation (12). When Resistance of the second resistor 205 and capacitance of the second capacitor 206 are trimmed a nonflatness designated by equation (7) in FIG. 7 may still be present due to variation of the components.

Figure 8:
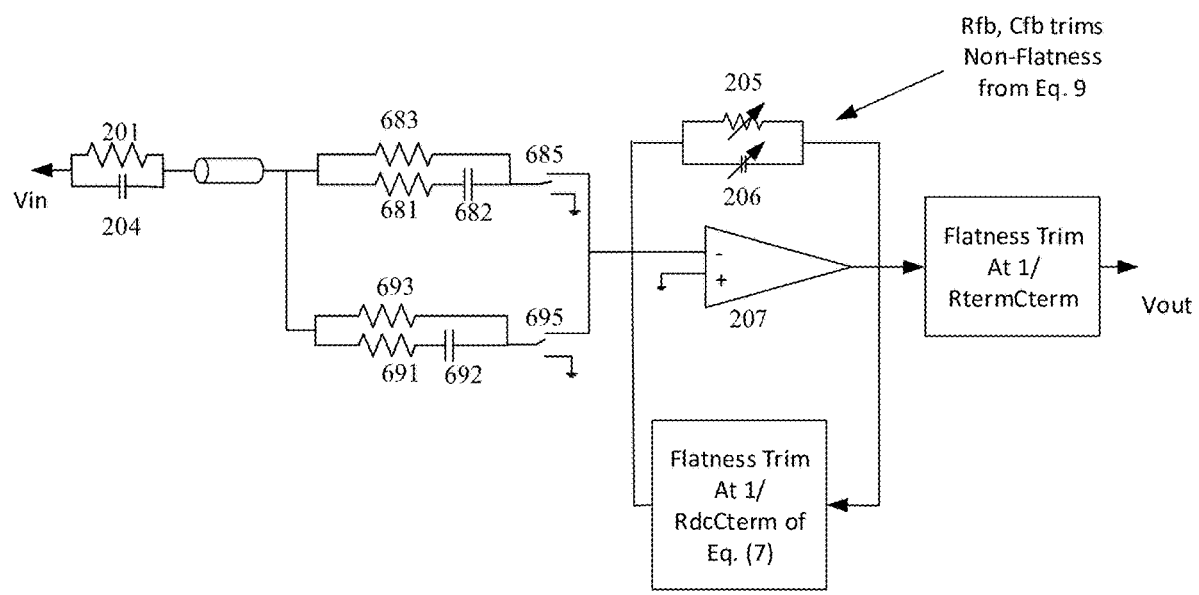
FIG. 8 illustrates a high dynamic range active pole-zero oscilloscope probe with frequency response flatness trims, in accordance with another representative embodiment.

Accordingly, a further trim can be used with time constants set by equation (7) to correct for this nonflatness. A final trim is used to remove the nonflatness at 1/RtermCterm between equation (11) and equation (12). These trims are illustrated in FIG. 8 below. On an integrated circuit, all of these trims can be controlled with registers accessed through a serial programming interface (SPI). Attenuation of a pole-zero oscilloscope probe can be made dynamically selectable via registers when these registers are made accessible through a serial programming interface. Such registers may be made accessible through the serial programming interface, and can be configured to control electronic trimming of the zero frequency created by the first terminating capacitor 682, the second terminating capacitor 692, the first direct current coupled resistor 683 and the second direct current coupled resistor 693 to tune probe frequency response flatness against variation in the first terminating capacitor 682, the second terminating capacitor 692, the first direct current coupled resistor 683, the second direct current coupled resistor 693, the first resistor 201, the first capacitor 204, and cable capacitance in a frequency range defined by a zero created with the first terminating capacitor 682, the second terminating capacitor 692, the first direct current coupled resistor 683, and the second direct current coupled resistor 693.

FIG. 8 illustrates a high dynamic range active pole-zero oscilloscope probe with frequency response flatness trims, in accordance with another representative embodiment.

In FIG. 8, the high dynamic range active pole-zero oscilloscope probe includes the first resistor 201, the first capacitor 204, the second resistor 205, the second capacitor 206, and the amplifier 207. The high dynamical range active pole-zero oscilloscope probe also includes a first loop that is switchable by a first switch 685 and which includes the first terminating resistor 681, the first terminating capacitor 682, and the first direct current coupled resistor 683. The high dynamic range active pole-zero oscilloscope probe also includes a second loop that is switchable by a second switch 695 and which includes the second terminating resistor 691, the second terminating capacitor 692, and the second direct current coupled resistor 693. In FIG. 8 and other embodiments with switchable attenuation, one of the first loop circuit and the second loop circuit is switched to connect to ground while the other of the first loop circuit and the second loop circuit is switched to connect to the inverting input of the amplifier 207.

If component values were chosen such that the nonflatness associated with Eq. (7) occurs at the same frequency as that of Eq. (9) to minimize the amount of trims needed, either Cterm would be lowered or Ctip increased. Lowering Cterm reduces the midband gain of equation (11), resulting in larger nonflatness at 1/RtermCterm. Increasing Ctip, increases probe loading of the DUT. Accordingly, component values are chosen to achieve other effects for the reasons described herein.

As described above a pole-zero probe with selectable input attenuation increases dynamic range due to the ability to select the input attenuation. Additionally, input attenuator component values can be selected to terminate the cable characteristic impedance Zo of the probe cable at high frequencies to increase bandwidth and maintain a flat high frequency response. Input attenuator component values can be selected to minimize frequency response nonflatness, noise, offset, and drift at DC and midband frequencies. For example, the input attenuator component values can be selected to minimize frequency response nonflatness, noise, offset, and drift in a frequency band between direct current and a pole frequency set by the second resistor 205 and the second capacitor 206. Moreover, as described with respect to FIG. 8, electronic trims can be provided to allow further flattening of the frequency response against component variations resulting from selecting input attenuator component values. In other words, electronic trims can be provided to allow tuning of probe frequency response against variation resulting from the first terminating capacitor 682, the second terminating capacitor 692, the first direct current coupled resistor 683, the second direct current coupled resistor 693, the first resistor 201, the first capacitor 204, and cable capacitance in a frequency range defined by a zero created with the first terminating capacitor 682, the second terminating capacitor 692, the first direct current coupled resistor 683, and the second direct current coupled resistor 693.

That is, a zero frequency may be created by the first terminating capacitor 682, the second terminating capacitor 692, the first direct current coupled resistor 683 and the second direct current coupled resistor 693. Attenuation can be made dynamically selectable via registers accessible through a serial programming interface. The registers may be configured to control electronic trimming of the zero frequency. As a result, probe frequency response flatness may be tuned against variation in the first terminating capacitor 682, the second terminating capacitor 692, the first direct current coupled resistor 683, the second direct current coupled resistor 693, the first resistor 601, the first capacitor 604, and cable capacitance.

Accordingly, high dynamic range probe using pole-zero cancellation enables an increased dynamic range. The oscilloscope probes described herein are typically characterized as pole-zero oscilloscope probes that include at least a low-loss cable, dynamically switchable (selectable) attenuation to achieve the increased dynamic range, or both the low-loss cable and the dynamically switchable (selectable) attenuation.

Although high dynamic range probe using pole-zero cancellation has been described with reference to several exemplary embodiments, it is understood that the words that have been used are words of description and illustration, rather than words of limitation. Changes may be made within the purview of the appended claims, as presently stated and as amended, without departing from the scope and spirit of high dynamic range probe using pole-zero cancellation in its aspects. Although high dynamic range probe using pole-zero cancellation has been described with reference to particular means, materials and embodiments, high dynamic range probe using pole-zero cancellation is not intended to be limited to the particulars disclosed; rather high dynamic range probe using pole-zero cancellation extends to all functionally equivalent structures, methods, and uses such as are within the scope of the appended claims.

The illustrations of the embodiments described herein are intended to provide a general understanding of the structure of the various embodiments. The illustrations are not intended to serve as a complete description of all of the elements and features of the disclosure described herein. Many other embodiments may be apparent to those of skill in the art upon reviewing the disclosure. Other embodiments may be utilized and derived from the disclosure, such that structural and logical substitutions and changes may be made without departing from the scope of the disclosure. Additionally, the illustrations are merely representational and may not be drawn to scale. Certain proportions within the illustrations may be exaggerated, while other proportions may be minimized. Accordingly, the disclosure and the figures are to be regarded as illustrative rather than restrictive.

One or more embodiments of the disclosure may be referred to herein, individually and/or collectively, by the term "invention" merely for convenience and without intending to voluntarily limit the scope of this application to any particular invention or inventive concept. Moreover, although specific embodiments have been illustrated and described herein, it should be appreciated that any subsequent arrangement designed to achieve the same or similar purpose may be substituted for the specific embodiments shown. This disclosure is intended to cover any and all subsequent adaptations or variations of various embodiments. Combinations of the above embodiments, and other embodiments not specifically described herein, will be apparent to those of skill in the art upon reviewing the description.

The Abstract of the Disclosure is provided to comply with 37 C.F.R. § 1.72(b) and is submitted with the understanding that it will not be used to interpret or limit the scope or meaning of the claims. In addition, in the foregoing Detailed Description, various features may be grouped together or described in a single embodiment for the purpose of streamlining the disclosure. This disclosure is not to be interpreted as reflecting an intention that the claimed embodiments require more features than are expressly recited in each claim. Rather, as the following claims reflect, inventive subject matter may be directed to less than all of the features of any of the disclosed embodiments. Thus, the following claims are incorporated into the Detailed Description, with each claim standing on its own as defining separately claimed subject matter.

The preceding description of the disclosed embodiments is provided to enable any person skilled in the art to practice the concepts described in the present disclosure. As such, the above disclosed subject matter is to be considered illustrative, and not restrictive, and the appended claims are intended to cover all such modifications, enhancements, and other embodiments which fall within the true spirit and scope of the present disclosure. Thus, to the maximum extent allowed by law, the scope of the present disclosure is to be determined by the broadest permissible interpretation of the following claims and their equivalents and shall not be restricted or limited by the foregoing detailed description.

The invention claimed is:
1. An oscilloscope probe, comprising:
   a tip network connected to a low-loss signal cable, comprising a first resistor and a first capacitor in parallel with the first resistor, and configured to electrically connect to a device under test via a tip network node between the first resistor and the first capacitor; the low-loss signal cable; and a terminating assembly comprising:
an amplifier with an inverting input, a non-inverting input connected to ground, and an amplifier output configured to connect to an oscilloscope input,
a feedback network comprising a second resistor and a second capacitor in parallel with the second resistor, and connected between the inverting input and the amplifier output, and
a terminating attenuator that includes:
a first loop circuit between the low-loss signal cable and the inverting input of the amplifier, and comprising a first terminating resistor and a first terminating capacitor in series with the first terminating resistor, and a first direct current coupled resistor in parallel with the first terminating resistor and the first terminating capacitor; and
a second loop circuit between the low-loss signal cable and ground, and comprising a second terminating resistor and a second terminating capacitor in series with the second terminating resistor, and a second direct current coupled resistor in parallel with the second terminating resistor and the second terminating capacitor,
wherein: resistance of the first terminating resistor and the second terminating resistor are selected to match cable characteristic impedance, Zo, of the low-loss signal cable; and attenuation of the oscilloscope probe is dynamically selectable via registers accessible through a serial programming interface and configured to control electronic trimming of the second resistor and the second capacitor.

2. The oscilloscope probe of claim 1, wherein the first direct current coupled resistor and the second direct current coupled resistor have resistances higher than resistances of the first terminating resistor and the second terminating resistor and selected to reduce low frequency noise gain of the amplifier.

3. The oscilloscope probe of claim 1,
wherein the first terminating capacitor, the second terminating capacitor, the first terminating resistor and the second terminating resistor are set to terminate the low-loss signal cable at a frequency lower than 1/cable time delay.

4. The oscilloscope probe of claim 1,
wherein a probe frequency response is created by the first resistor, the first capacitor, cable capacitance of the low-loss signal cable, the first terminating capacitor, the second terminating capacitor, the first direct current coupled resistor and the second direct current coupled resistor, and
wherein values of the first terminating capacitor, the second terminating capacitor, the first direct current coupled resistor and the second direct current coupled resistor create a zero in the probe frequency response and are selected to cancel a pole in the probe frequency response to flatten the probe frequency response in a frequency region defined by the pole and the zero.

5. The oscilloscope probe of claim 1,
wherein a zero in a probe frequency response is set by the first resistor and the first capacitor, and
values of the second resistor and the second capacitor are selected to form a pole in the probe frequency response that equals the zero in the probe frequency response set by the first resistor and the first capacitor, to flatten the probe frequency response in a frequency region defined by the pole and the zero.

6. The oscilloscope probe of claim 1,
wherein values of the first terminating capacitor, the second terminating capacitor, the first direct current coupled resistor and the second direct current coupled resistor are selected to minimize noise, offset, and drift in a frequency band between direct current and a pole frequency set by the second resistor and the second capacitor.

7. The oscilloscope probe of claim 1, further comprising:
registers accessible through a serial programming interface, and configured to control electronic trimming of a zero frequency created by the first terminating capacitor, the second terminating capacitor, the first direct current coupled resistor and the second direct current coupled resistor to tune probe frequency response flatness against variation in the first terminating capacitor, the second terminating capacitor, the first direct current coupled resistor, the second direct current coupled resistor, the first resistor, the first capacitor, and cable capacitance in a frequency range defined by a zero created with the first terminating capacitor, the second terminating capacitor, the first direct current coupled resistor, and the second direct current coupled resistor.

8. The oscilloscope probe of claim 1, wherein the amplifier and the feedback network are implemented on an integrated circuit, and each of the second resistor and the second capacitor is electronically trimmable.

9. The oscilloscope probe of claim 8, further comprising:
registers accessible through a serial programming interface and configured to control electronic trimming of the second resistor and the second capacitor.

10. A pole-zero oscilloscope probe, comprising:
a tip network connected to a low-loss signal cable, comprising a first resistor and a first capacitor in parallel with the first resistor, and configured to electrically connect to a device under test via a tip network node between the first resistor and the first capacitor;
the low-loss signal cable; and
a terminating assembly comprising:
an amplifier with an inverting input, a non-inverting input connected to ground, and an amplifier output configured to connect to an oscilloscope input,
a feedback network comprising a second resistor and a second capacitor in parallel with the second resistor, and connected between the inverting input and the amplifier output, and
a terminating attenuator that includes:
a first loop circuit between the low-loss signal cable and the inverting input of the amplifier, and comprising a first terminating resistor and a first terminating capacitor in series with the first terminating resistor, and a first direct current coupled resistor in parallel with the first terminating resistor and the first terminating capacitor; and
a second loop circuit between the low-loss signal cable and ground, and comprising a second terminating resistor and a second terminating capacitor in series with the second terminating resistor, and a second direct current coupled resistor in parallel with the second terminating resistor and the second terminating capacitor,
wherein attenuation of the pole-zero oscilloscope probe is dynamically selectable via a switching network used to switch the first loop circuit and the second loop circuit between connections to ground and connections to the inverting input of the amplifier.

11. The pole-zero oscilloscope probe of claim 10, wherein one of the first loop circuit and the second loop circuit is switched to connect to ground while the other of the first loop circuit and the second loop circuit is switched to connect to the inverting input of the amplifier.

12. The pole-zero oscilloscope probe of claim 10, wherein attenuation of the pole-zero oscilloscope probe is dynamically selectable via registers accessible through a serial programming interface and configured to control electronic trimming of the second resistor and the second capacitor.

13. The pole-zero oscilloscope probe of claim 10, wherein the first terminating capacitor, the second terminating capacitor, the first terminating resistor and the second terminating resistor are set to terminate the low-loss signal cable at a frequency lower than 1/cable time delay.

14. The pole-zero oscilloscope probe of claim 10, wherein a probe frequency response is created by the first resistor, the first capacitor, cable capacitance of the low-loss signal cable, the first terminating capacitor, the second terminating capacitor, the first direct current coupled resistor and the second direct current coupled resistor, and wherein values of the first terminating capacitor, the second terminating capacitor, the first direct current coupled resistor and the second direct current coupled resistor create a zero in the probe frequency response and are selected to cancel a pole in the probe frequency response to flatten the probe frequency response in a frequency region defined by the pole and the zero.

15. The pole-zero oscilloscope probe of claim 10, wherein a zero in a probe frequency response is set by the first resistor and the first capacitor, and values of the second resistor and the second capacitor are selected to form a pole in the probe frequency response that equals the zero in the probe frequency response set by the first resistor and the first capacitor, to flatten the probe frequency response in a frequency region defined by the pole and the zero.

16. The pole-zero oscilloscope probe of claim 10, wherein values of the first terminating capacitor, the second terminating capacitor, the first direct current coupled resistor and the second direct current coupled resistor are selected to minimize noise, offset, and drift in a frequency band between direct current and a pole frequency set by the second resistor and the second capacitor.

17. The pole-zero oscilloscope probe of claim 10, further comprising:

registers accessible through a serial programming interface, and configured to control electronic trimming of a zero frequency created by the first terminating capacitor, the second terminating capacitor, the first direct current coupled resistor and the second direct current coupled resistor to tune probe frequency response flatness against variation in the first terminating capacitor, the second terminating capacitor, the first direct current coupled resistor, the second direct current coupled resistor, the first resistor, the first capacitor, and cable capacitance in a frequency range defined by a zero created with the first terminating capacitor, the second terminating capacitor, the first direct current coupled resistor, and the second direct current coupled resistor.

18. The pole-zero oscilloscope probe of claim 10, wherein the terminating attenuator further comprises:

a plurality of switches configured to dynamically switch the first loop circuit between the low-loss signal cable and the inverting input of the amplifier and between the tip network and ground, and to switch the second loop circuit between the low-loss signal cable and the inverting input of the amplifier and between the tip network and ground.

* * * * *